US008753985B2

(12) United States Patent
Underwood et al.

(10) Patent No.: US 8,753,985 B2
(45) Date of Patent: Jun. 17, 2014

(54) MOLECULAR LAYER DEPOSITION OF SILICON CARBIDE

(71) Applicant: Applied Materials, Inc., Santa Clara, CA (US)

(72) Inventors: Brian Underwood, Santa Clara, CA (US); Abhijit Basu Mallick, Palo Alto, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 13/628,355

(22) Filed: Sep. 27, 2012

(65) Prior Publication Data

US 2013/0267079 A1 Oct. 10, 2013

Related U.S. Application Data

(60) Provisional application No. 61/587,397, filed on Jan. 17, 2012.

(51) Int. Cl.
*H01L 21/31* (2006.01)
*H01L 21/469* (2006.01)

(52) U.S. Cl.
USPC ........... 438/779; 438/475; 438/535; 438/602; 438/931; 257/E21.006; 257/E21.077; 257/E21.109; 257/E21.274; 257/E21.311; 257/E21.312; 257/E21.328; 257/E21.347; 257/E21.475

(58) Field of Classification Search
USPC ......... 438/779, 931, 475, 535, 602, 483, 513, 438/518, 463, 603, 604, 509; 257/E21.006, 257/E21.077, E21.109, E21.274, E21.311, 257/E21.312, E21.328, E21.347, E21.475
See application file for complete search history.

(56) References Cited

U.S. PATENT DOCUMENTS

| 4,459,338 | A | | 7/1984 | Angelini et al. |
| 4,560,589 | A | | 12/1985 | Endou et al. |
| 4,564,533 | A | | 1/1986 | Yamazaki |
| 4,923,716 | A | | 5/1990 | Brown et al. |
| 5,354,580 | A | | 10/1994 | Goela et al. |
| 5,374,412 | A | * | 12/1994 | Pickering et al. ............. 423/346 |
| 6,573,168 | B2 | | 6/2003 | Kim et al. |
| 2011/0274874 | A1 | | 11/2011 | Pickering et al. |

FOREIGN PATENT DOCUMENTS

KR    10-2010-0103436 A    9/2010

OTHER PUBLICATIONS

International Search Report and Written Opinion of PCT/US2012/070642, mailed Apr. 12, 2013, 9 pages.

* cited by examiner

*Primary Examiner* — David Nhu
(74) *Attorney, Agent, or Firm* — Kilpatrick Townsend & Stockton LLP

(57) ABSTRACT

Molecular layer deposition of silicon carbide is described. A deposition precursor includes a precursor molecule which contains silicon, carbon and hydrogen. Exposure of a surface to the precursor molecule results in self-limited growth of a single layer. Though the growth is self-limited, the thickness deposited during each cycle of molecular layer deposition involves multiple "atomic" layers and so each cycle may deposit thicknesses greater than typically found during atomic layer depositions. Precursor effluents are removed from the substrate processing region and then the surface is irradiated before exposing the layer to the deposition precursor again.

18 Claims, 4 Drawing Sheets

US 8,753,985 B2

MOLECULAR LAYER DEPOSITION OF SILICON CARBIDE

CROSS-REFERENCES TO RELATED APPLICATIONS

This application claims the benefit of U.S. Provisional Application No. 61/587,397 by Underwood et al, filed Jan. 17, 2012 and titled "MOLECULAR LAYER DEPOSITION OF SILICON CARBIDE" which is incorporated herein in its entirety for all purposes.

BACKGROUND OF THE INVENTION

Silicon nitride dielectric films are used as etch stops and chemically inert diffusion barriers. Other applications benefit from the relatively high dielectric constant, which allows electrical signals to be rapidly transmitted through a silicon nitride layer. Conventional methods for depositing silicon nitride by chemical vapor deposition work for substrate temperatures more than 250° C. (often much more).

Silicon carbide offers improved performance as an etch stop, diffusion barrier and has a higher dielectric constant. Silicon carbide has been typically used as a substrate for incorporation as active devices but not as a layer deposited on a patterned substrate during formation of semiconducting devices. The cause of this relegation involves the difficulty in etching silicon carbide. The cause may further relate to the typically high deposition substrate temperatures necessary for many prior art silicon carbide chemical vapor deposition techniques. High temperatures, at the very least, may result in diffusion which would degrade electrical characteristics of miniature electrical devices.

Thus, there remains a need in the art for silicon carbide deposition processes appropriate for low deposition substrate temperatures which also offer enhanced control of deposition parameters. This and other needs are addressed in the present application.

BRIEF SUMMARY OF THE INVENTION

Molecular layer deposition of silicon carbide is described. A deposition precursor includes a precursor molecule which contains silicon, carbon and hydrogen. Exposure of a surface to the precursor molecule results in self-limited growth of a single layer. Though the growth is self-limited, the thickness deposited during each cycle of molecular layer deposition involves multiple "atomic" layers and so each cycle may deposit thicknesses greater than typically found during atomic layer depositions. Precursor effluents are removed from the substrate processing region and then the surface is irradiated before exposing the layer to the deposition precursor again.

Embodiments of the invention include methods of forming a silicon carbide layer on a surface of a substrate positioned in a substrate processing region. The methods include at least three sequential steps: (i) irradiating the surface of the substrate, (ii) exposing the surface to a silicon-carbon-and-hydrogen-containing precursor comprising a silicon-carbon-and-hydrogen-containing molecule, and (iii) removing process effluents including unreacted silicon-carbon-and-hydrogen-containing precursor from the substrate processing region. The silicon-carbon-and-hydrogen-containing molecule has at least two Si—C single-bonds. The step of exposing the surface to a silicon-carbon-and-hydrogen-containing precursor results in growth of a single molecular layer of silicon carbide.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Molecular layer deposition of silicon carbide is described. A deposition precursor includes a precursor molecule which contains silicon, carbon and hydrogen. Exposure of a surface to the precursor molecule results in self-limited growth of a single layer. Though the growth is self-limited, the thickness deposited during each cycle of molecular layer deposition involves multiple "atomic" layers and so each cycle may deposit thicknesses greater than typically found during atomic layer depositions. Precursor effluents are removed from the substrate processing region and then the surface is irradiated before exposing the layer to the deposition precursor again.

In many cases, traditional atomic layer deposition relies on the resilience of a "metal"-oxygen bond or presence of a carbonyl group. In both cases, the deposited film ends up with oxygen content. Oxygen content is very difficult to remove and compromises the performance of a silicon carbide film in etch resistance as well as most other parameters. Methods of growing silicon carbide in a layer-by-layer manner are presented herein which avoid the presence of oxygen, metal or other contaminants which compromise these parameters.

Figure 1:
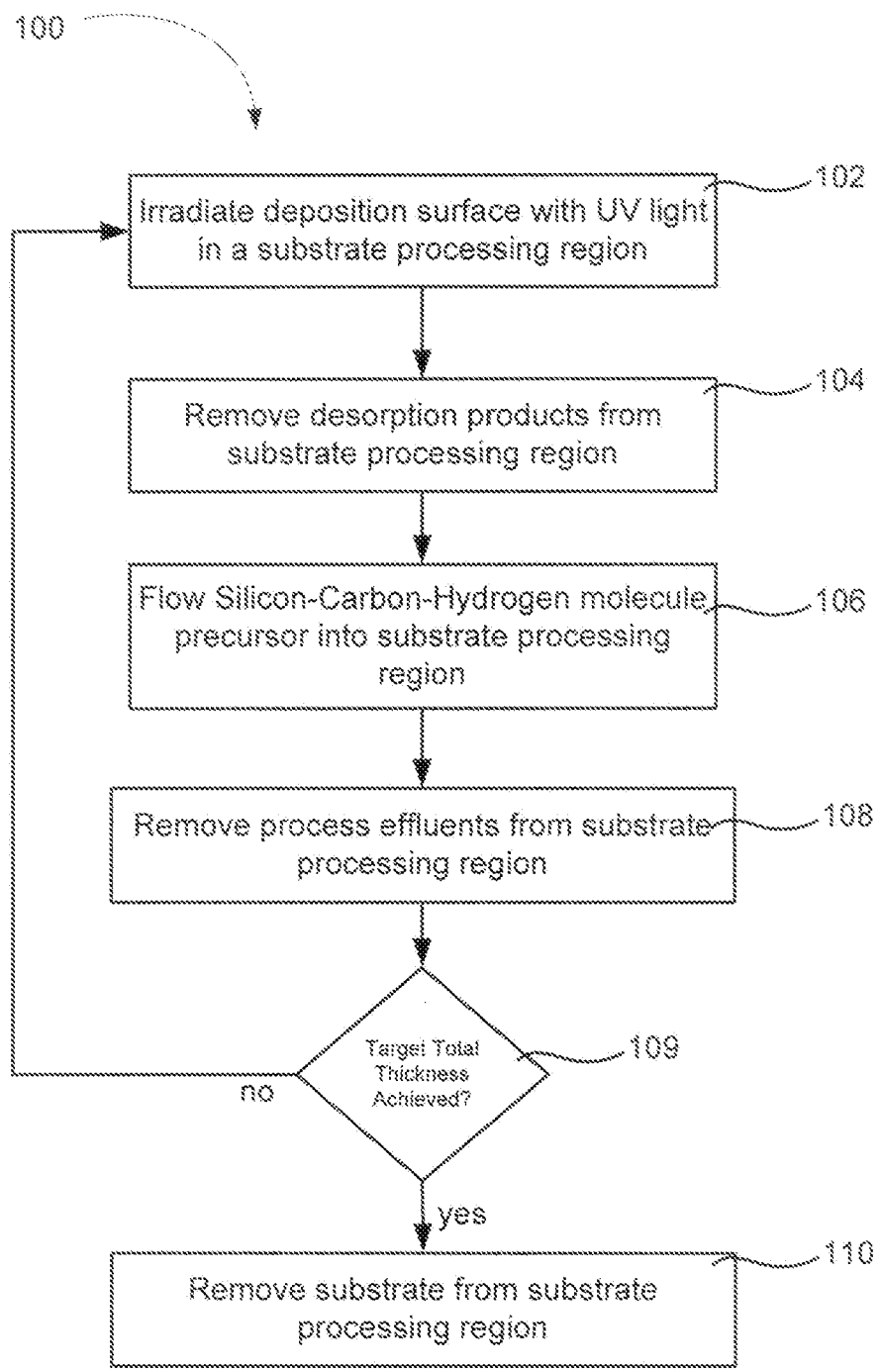
FIG. 1 is a flowchart illustrating selected steps for forming silicon carbide layers according to disclosed embodiments.

In order to better understand and appreciate the invention, reference is now made to FIGS. 1-2 which are a flowchart showing exemplary selected steps for performing molecular layer deposition and chemical schematics during representative molecular layer depositions according to embodiments of the invention. The method 100 includes irradiating a silicon surface having methyl groups bound to a first silicon adatom on the surface (step 102) to cleave the Si—Si single bond between the first adatom and a second silicon atom near the surface. The irradiation therefore desorbs a $Si(CH_3)_3$ group from the surface of the substrate. The desorbed chemical fragment may be referred to herein as $Si(Me)_3$ for simplicity, replacing the methyl group with the shorthand form, Me. The desorbed chemical fragment is not limited to Si(Me)3 and will more generally be referred to herein as a protective group (PG) to convey that a future reaction site is "protected" by the chemical group. A protective group always has a silicon atom which bonds to the surface through an Si—Si bond. The desorbed chemical fragment (PG) is then removed from the substrate processing region in step 104.

Figure 2A:
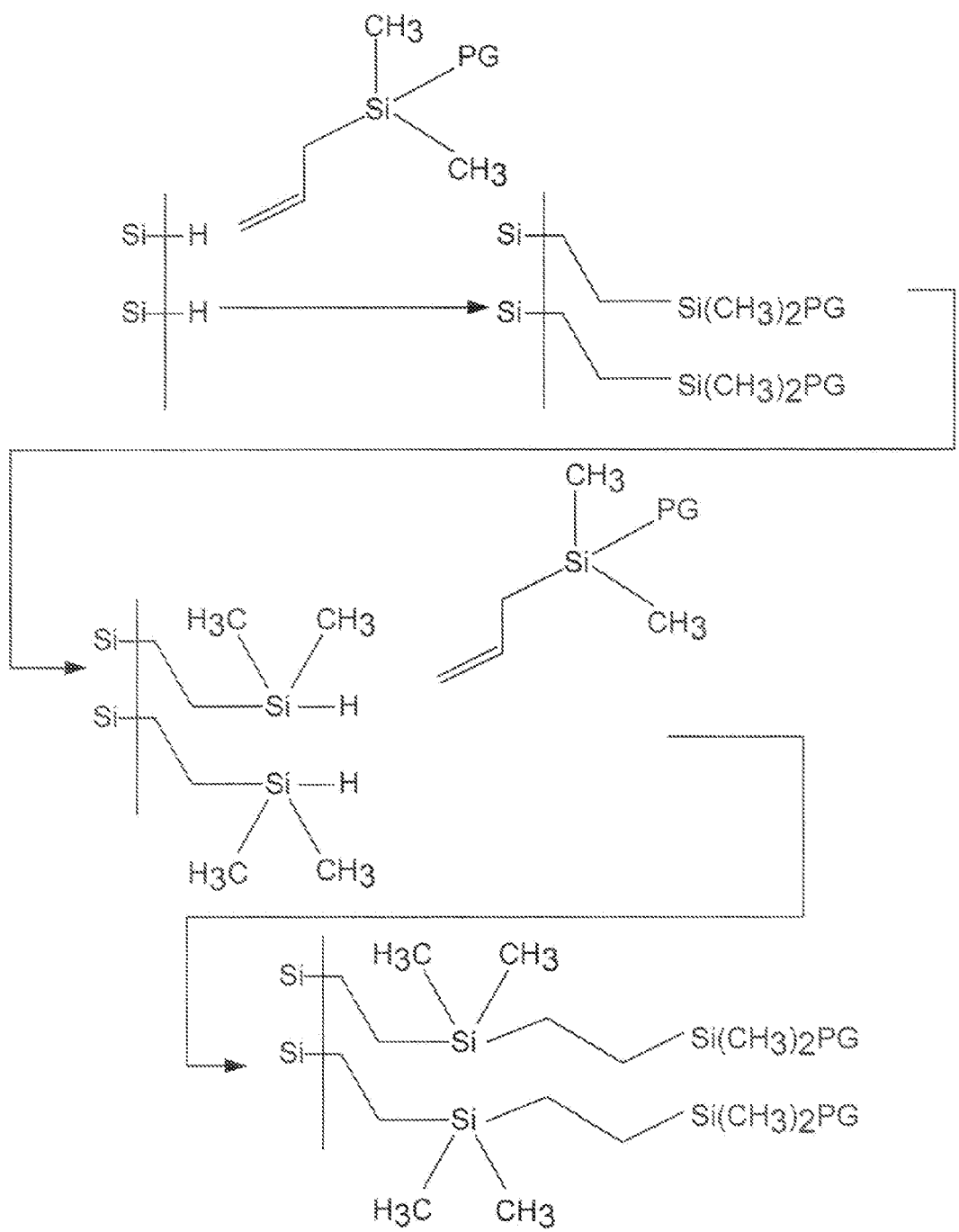
FIG. 2A is a chemical schematic of a molecular layer deposition according to disclosed embodiments.

Following irradiation, the exposed portion may either become a highly reactive silene (an exposed silicon atom with two free electrons available for bonding) or it may be hydrogen-terminated as shown in the left frame of FIG. 2. At this point, a silicon-carbon-and-hydrogen-containing precursor is delivered to the substrate processing region in step 106. The silicon-carbon-and-hydrogen-containing precursor comprises a silicon-carbon-and-hydrogen-containing molecule which has at least two silicon-carbon single-bonds, Si—C. As shown in the example of FIG. 2A, the silicon-carbon-and-hydrogen-containing molecule may have a vinyl group (C═C) and the vinyl group may be near an end of a carbon chain in embodiments of the invention.

The schematics of precursor molecules are shown with an industry standard shorthand to improve understanding by simplifying each schematic. Single lines represent a covalently shared electron and double lines represents two covalently shared electrons, i.e. a double bond. Line segment endpoints without letters indicate the presence of a carbon atom. Line segment endpoints having an "Si" indicate the presence of a silicon atom instead of a carbon atom. For example, the silicon-carbon-and-hydrogen-containing molecule shown approaching the hydrogen-terminated silicon surface on the far left of FIG. 2A has the chemical formula $C_3H_5$—Si—$C_2H_6$—PG. The schematic method will be used herein since the schematic method more completely defines the structure of the precursor molecules.

A vinyl group (C═C) may or may not be present in the silicon-carbon-and-hydrogen-containing molecule in disclosed embodiments. When present, the vinyl group enhances the reaction rate of the precursor with the exposed hydrogen on the surface of the substrate. The reaction may be promoted (with or without the vinyl group) by shining light on the surface during exposure (step 106) or providing another form of excitation. The wavelength of this catalytic light source may be longer than the UV light source used earlier to remove the protective groups.

After flowing the silicon-carbon-and-hydrogen-containing precursor to the substrate, the surface is represented in the second diagram from the left in FIG. 2A. In other words, the surface is terminated with Si(CH$_3$)$_2$PG groups. Process effluents, including any unreacted silicon-carbon-and-hydrogen-containing precursor, may now be removed from the substrate processing region in step 108. If the target thickness has been achieved (decision 109) deposition may stop and the deposition substrate may be removed from the substrate processing region in step 110. In the event that the target thickness has not been achieved, steps 102-108 are repeated to deposit another molecular layer. The substrate is again irradiated with UV light to cleave the Si—Si bond to liberate the protective group (PG). Liberating the protective group allows the deposition of an additional silicon carbide molecular layer to proceed when step 106 is repeated.

Figure 2B:
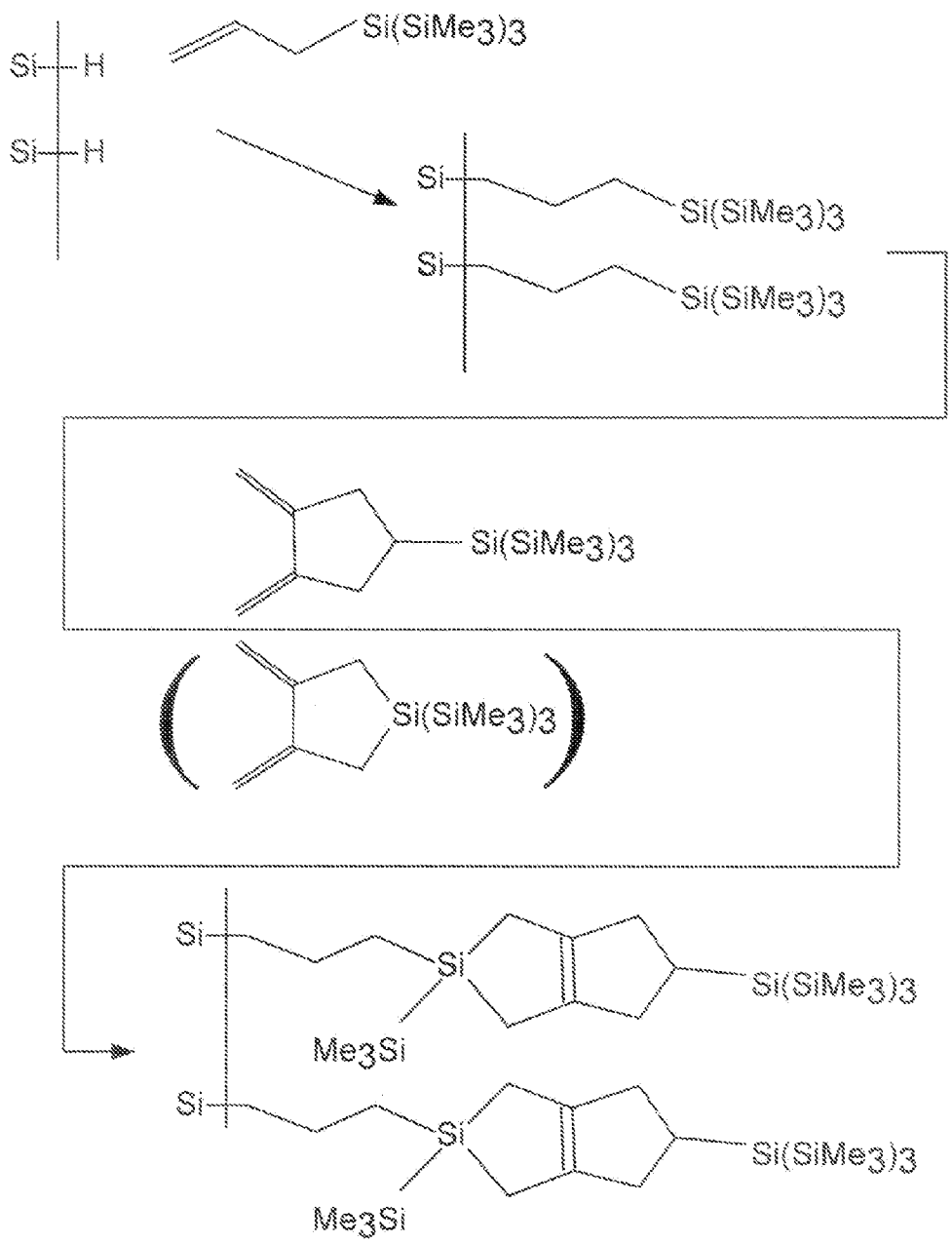
FIG. 2B is a chemical schematic of a molecular layer deposition according to disclosed embodiments.

FIG. 2B is another chemical schematic of a molecular layer deposition according to disclosed embodiments. In this schematic, the protective group is represented by the exemplary SiMe$_3$ and three protective groups are present on the silicon-carbon-and-hydrogen-containing molecule of the silicon-carbon-and-hydrogen-containing precursor. More than one protective group is present on a silicon-carbon-and-hydro-gen-containing molecule in some embodiments of the invention. The chemical formula of the molecule approaching the surface on the left frame of FIG. 2B is $C_3H_5$—Si—(PG)$_3$. Once again, the carbon-carbon double-bond provides the reactivity which forms the Si—C bond to the substrate surface. The surface is then irradiated to cleave the Si—Si bond and liberate the protective groups. Afterwards, a different silicon-carbon-and-hydrogen-containing molecule is exposed to the growing network of silicon carbide. The second dosing involves a precursor including one of the two conjugated diene molecules shown. The top molecule has chemical formula $C_7H_8$—Si—(PG)$_3$ and the bottom molecule has chemical formula $C_6H_8$—Si—PG.

Process effluents, including unreacted H$_2$O, are removed from the substrate processing region in step 108. The process effluents may be removed by flowing inert species into the substrate processing region to flush the process effluents away from the processing region. Alternatively or in combination, the process effluents may be pumped away through a pumping port to a pumping system. The four sequential steps (steps 102-108) can be repeated until a target thickness is achieved (decision 109). The deposition sequence comprising the repeated application of the four sequential steps produces a silicon carbide layer on the substrate.

A cycle of silicon carbide molecular layer deposition (steps 102-108) lasts less than 20 seconds, 10 seconds, 5 seconds or 2 seconds in disclosed embodiments. The method allows additional material to be deposited within each cycle compared to atomic layer deposition cycles performed with traditional precursors according to traditional process sequences. A cycle of silicon carbide molecular layer deposition (four sequential steps 102-108) deposits more than 0.5 nm, more than 1 nm, less than 6 nm, between about 0.5 nm and about 6 nm or between about 1 nm and about 6 nm of silicon carbide on the substrate in disclosed embodiments. The pressure within the substrate processing region is below 40 mTorr, 20 mTorr or 10 mTorr during the step of exposing the surface to the silicon-carbon-and-hydrogen-containing precursor in disclosed embodiments. The substrate temperature may be less than 300° C., 200° C. or 150° C. during the step of exposing the surface to the silicon-carbon-and-hydrogen-containing precursor in embodiments of the invention.

Figure 3:
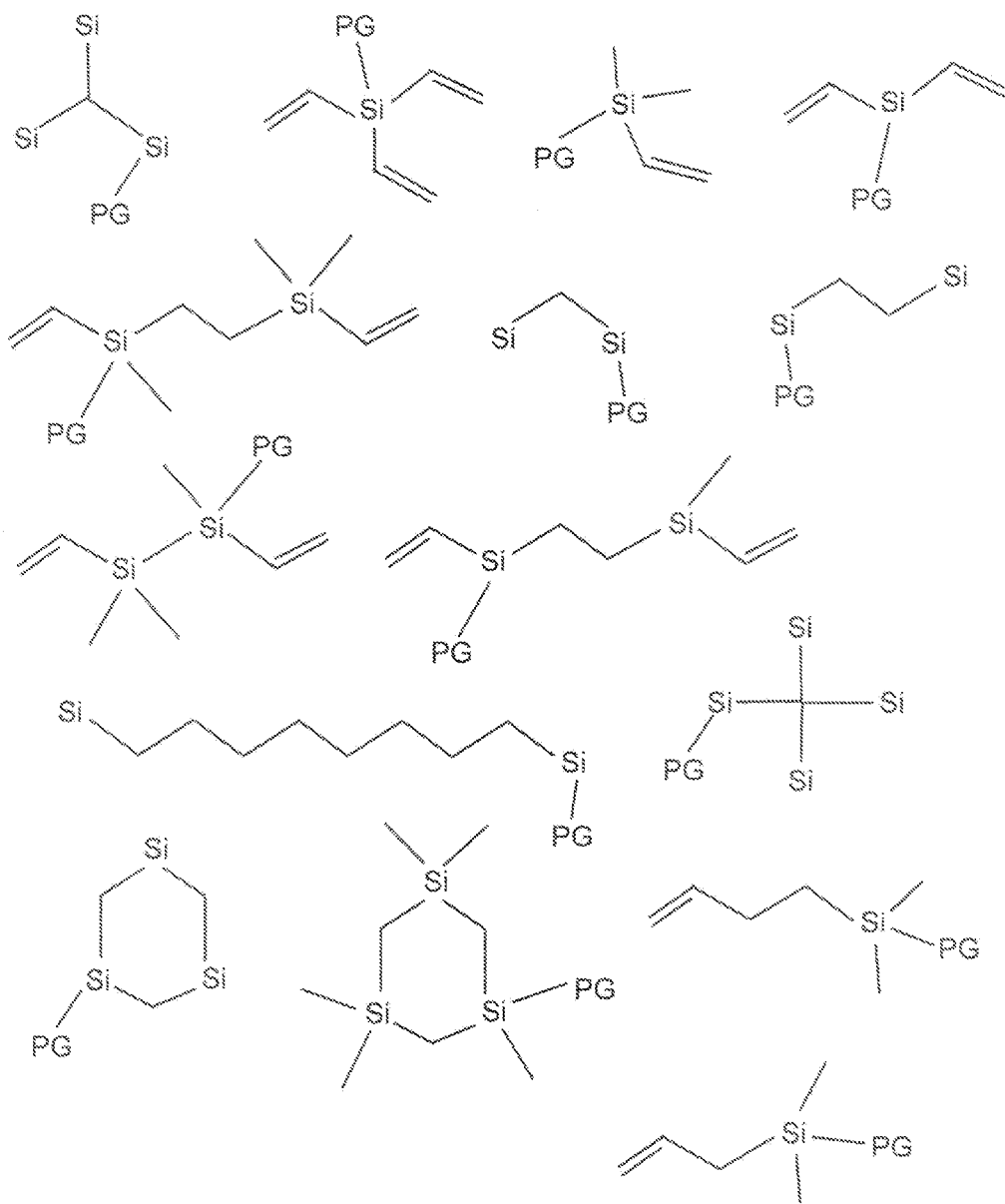
FIG. 3 shows additional silicon-carbon-and-hydrogen-containing precursor molecules for use in molecular layer deposition according to disclosed embodiments.

The benefits and process parameters described above extend to a wider variety of silicon-carbon-and-hydrogen-containing precursors than those described heretofore. Exemplary silicon-carbon-and-hydrogen-containing precursors are represented as chemical schematics in FIG. 3. Protective groups are shown in exemplary locations in each of the represented precursor molecules. The protective groups may be at other locations, replacing either an H or a methyl group (Me). Multiple (for example two or three) protective groups may appear on any of the exemplary precursors represented. A radical trap such as TEMPO may be further included during the step of exposing the surface to the silicon-carbon-and-hydrogen-containing precursor. The further inclusion of a radical trap may serve to avoid premature reaction of a highly reactive silicon-carbon-and-hydrogen-containing precursor. Double bonds may be retained by inclusion of a radical trap in the substrate processing region and therefore may be more readily available for silicon carbide molecular layer deposition.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon carbide" is used as a shorthand for and interchangeably with a silicon-and-carbide-containing material. As such, silicon carbide may include concentrations of other elemental constituents such as nitrogen, hydrogen, and the like. In some embodiments, silicon carbide consists essentially of silicon and carbon. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A "gas" (or a "precursor") may be a combination of two or more gases (or "precursors") and may include substances which are normally liquid or solid but temporarily carried along with other "carrier gases." The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench (as viewed from above) which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon carbide layer on a surface of a substrate positioned in a substrate processing region, the method comprising:
    at least three sequential steps comprising:
        (i) irradiating the surface of the substrate,
        (ii) exposing the surface to a silicon-carbon-and-hydrogen-containing precursor comprising a silicon-carbon-and-hydrogen-containing molecule, wherein the silicon-carbon-and-hydrogen-containing molecule has at least two Si—C single-bonds, wherein exposing the surface to a silicon-carbon-and-hydrogen-containing precursor results in growth of a single molecular layer of silicon carbide, and
        (iii) removing process effluents including unreacted silicon-carbon-and-hydrogen-containing precursor from the substrate processing region.

2. The method of claim 1, further comprising repeating the at least three sequential steps again until the silicon carbide layer reaches a target thickness.

3. The method of claim 1, wherein irradiating the surface comprises shining UV light at the surface of the substrate.

4. The method of claim 1, wherein irradiating the surface comprises flowing gas into and striking a plasma within the substrate processing region.

5. The method of claim 1, wherein exposing the surface to a silicon-carbon-and-hydrogen-containing precursor results in self-limiting growth of the single-molecular layer of silicon carbide.

6. The method of claim 1, wherein an iteration of steps (i)-(iii) deposits between 0.5 nm and 6 nm of silicon carbide on the substrate.

7. The method of claim 1, wherein the silicon-carbon-and-hydrogen-containing molecule comprises a carbon-carbon double-bond.

8. The method of claim 1, wherein the silicon-carbon-and-hydrogen-containing molecule comprises a protective group which makes the growth of the single molecular layer of silicon carbide self-limiting yet allows removal of the protective group through irradiation of the surface.

9. The method of claim 8, wherein the protective group comprises a silicon atom bonded to another silicon atom within the silicon-carbon-and-hydrogen-containing molecule.

10. The method of claim 8, wherein the protective group comprises $Si(CH_3)_3$.

11. The method of claim 1, wherein the silicon-carbon-and-hydrogen-containing molecule comprises one of the following molecules with one or more protective groups bonded to a silicon atom in place of a terminal H or Me group

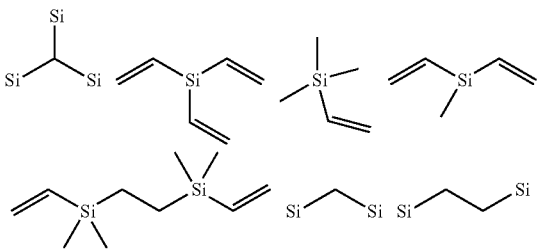

-continued

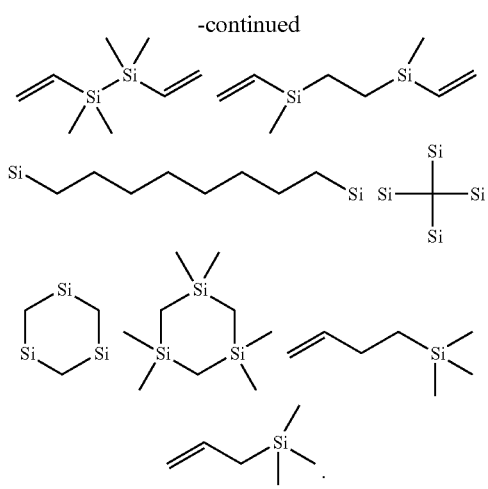

12. The method of claim 1, wherein the silicon carbide layer is essentially devoid of oxygen.

13. The method of claim 1, wherein the silicon-carbon-and-hydrogen-containing molecule is essentially devoid of oxygen.

14. The method of claim 1, wherein the silicon-carbon-and-hydrogen-containing molecule comprises oxygen but the silicon carbide layer is essentially devoid of oxygen.

15. The method of claim 1, wherein the step of irradiating the surface comprises cleaving an Si—Si bond.

16. The method of claim 1, wherein the step of irradiating the surface comprises removing a protective chemical group from the surface.

17. The method of claim 16, wherein the step of irradiating the surface comprises removing more than one protective chemical group from the surface.

18. The method of claim 1, further comprising treating the surface to reduce the hydrogen content in the silicon carbide layer after the silicon carbide is deposited.

* * * * *